United States Patent
Fujii et al.

(10) Patent No.: US 6,300,628 B1
(45) Date of Patent: Oct. 9, 2001

(54) FOCUSED ION BEAM MACHINING METHOD AND DEVICE THEREOF

(75) Inventors: Toshiaki Fujii; Yasuhiko Sugiyama; Toshio Doi, all of Chiba (JP)

(73) Assignee: Seiko Instruments Inc. (JP)

(*) Notice: Subject to any disclaimer, the term of this patent is extended or adjusted under 35 U.S.C. 154(b) by 0 days.

(21) Appl. No.: 09/207,823

(22) Filed: Dec. 9, 1998

(30) Foreign Application Priority Data

Dec. 11, 1997 (JP) .................................................. 9-241754
Dec. 15, 1997 (JP) .................................................. 9-345401
Dec. 4, 1998 (JP) .................................................. 10-346157

(51) Int. Cl.$^7$ .................................................. H01J 37/305
(52) U.S. Cl. .................. 250/309; 250/310; 250/396 R; 250/492.2; 250/492.21; 250/423 R
(58) Field of Search .................................. 250/309, 310, 250/492.2, 292.21, 423 R, 396 R

(56) References Cited

U.S. PATENT DOCUMENTS 5,055,696 * 10/1991 Haraichi et al. .................. 250/492.2
5,840,630 * 11/1998 Cecere et al. ........................ 438/712
5,854,488 * 12/1998 Aita ...................................... 250/309

* cited by examiner

Primary Examiner—Bruce Anderson
Assistant Examiner—Nikita Wells
(74) Attorney, Agent, or Firm—Adams & Wilks

(57) ABSTRACT

A focused ion beam machining method for etching the surface of a sample to obtain a desired profile formation portion by recurrently irradiating a focused ion beam to a desired region of the sample, wherein the recurrently scanned region is enlarged with the elapse of time during the etching and scanning of the sample with the focused ion beam is performed in parallel with the profile formation portion, and the profile formation portion is scanned after all other portions of the recurrently scanned region have been scanned.

32 Claims, 5 Drawing Sheets

$t = d/k$    END

FOCUSED ION BEAM MACHINING METHOD AND DEVICE THEREOF

BACKGROUND OF THE INVENTION

1. Field of the Invention

The present invention relates to a focused ion beam machining method for obtaining by use of focused ion beam apparatus the cross-section or profile of a specimen, and also relates to a machining apparatus adaptable for use therewith. Generally, the specimen profile is for use in observation and analysis.

2. Description of Related Art

A typical focused ion beam machining method employing such focused ion beam apparatus to obtain the profile of a specimen is disclosed in, for example, Japanese Laid-open Patent Application, Tokkaisho 62-174918. The method disclosed therein is designed to first determine a rectangular region to be machined in a manner such that a specified portion being machined to have a desired cross-sectional pattern is aligned in position with one side of an ion beam scanning irradiation region. Then, irradiation of an ion beam onto the to-be-machined region gets started causing the to-be-machined region to become narrower with time in the sub-scanning direction. One feature of the prior known method is that the specimen may be etched most deeply at its specified portion whereat the intended profile is to be formed, which is attainable by causing the profile formation portion to not change in one side thereof at this time.

Unfortunately, during such profile formation, once-etched materials can badly behave to again attach or "re-attach" to surfaces of the specimen at those locations in or near the machining region, resulting in contamination of the cross-section of interest to be obtained. The prior art method taught by the above-identified Japanese document is designed so that the machining region becomes smaller gradually and thus is associated with a serious problem that reattached materials can be deposited in the previously machined region. Another problem faced with the conventional method is that such unwanted deposition would result in inability to accurately perform the profile observation and/or analysis required.

It is therefore an object of the present invention disclosed and claimed herein to avoid the problems encountered with the prior art and to enable achievement of machining of a specimen with less risk of reattachment within a shortened time period.

SUMMARY OF THE INVENTION

To attain the foregoing objective, the first means of the present invention is featured in that while a region to be machined is determined so that its profile formation portion is aligned with one side of an ion beam scan region, the to-be-machined region is being widened or "expanded" with progress in machining process. And, the second means of the present invention is featured in that when scanning an ion beam in the to-be-machined region, the profile formation location is last scanned after all others.

DETAILED DESCRIPTION OF THE PREFERRED EMBODIMENT

Before explaining the principles of the present invention, a focused ion beam machining apparatus will first be explained in conjunction with FIG. 2.

Figure 2:
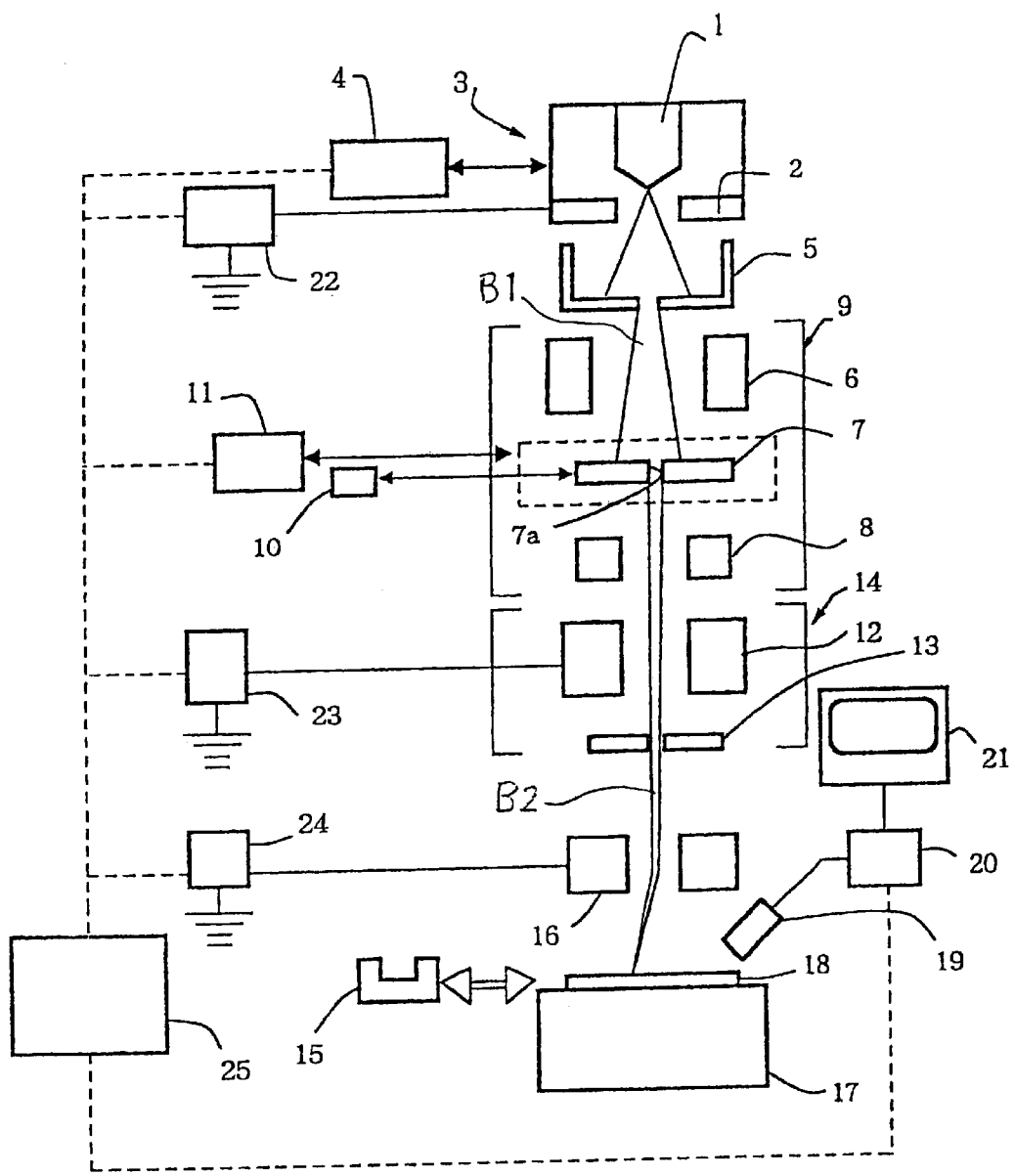
FIG. 2 is a diagram-showing, in schematical block form, an overall configuration of a focused ion beam apparatus used for implementation of machining methodology in accordance with the present invention.

FIG. 2 depicts schematically a configuration of a focused ion beam apparatus. As shown herein, the apparatus is configured including an ion source module 3 which has a liquid-metal ion source 1 comprised of gallium (Ga), for example, and a draw-out electrode 2. The ion source module 3 is mounted on an XY-direction movable device 4 so that the module is movable in two directions, X and Y, which are at right angles to a beam being generated. An ion beam B1 is drawn out of the liquid-metal ion source 1 upon application of a drive voltage from the drawout electrode 2. On the beam irradiation side of the ion source module 3 a first aperture 5 is disposed which is for use in letting only the central part of such high intensity ion beam B1 as generated from the ion source unit 1 pass through it, which part is high in current density. The first aperture 5 has its output side on which a charged particle optical system 9 is disposed which is made up from a condenser lens 6 and a second aperture 7 as well as an objective lens 8. The high intensity ion beam B1 generated from the ion source 1 is focused by the charged particle optical system 9 (especially, by the lenses 6, 8) to become a focused ion beam B2.

It should be noted here that the second aperture 7 has a plurality of penetration openings or holes 7a of different diametric sizes, which are selectively switchable by a penetration hole switcher device 10. More specifically, the second aperture 7 is designed to be modifiable among plural size-different penetration holes 7a under control of the penetration hole switcher 10. Note that although in this example the diametric sizes of penetration holes 7a are changeable by sliding a certain member having such plural penetration holes 7a different in diameter from one another, this hole diameter change may also be attained in a way such that a single penetration hole 7a is employed which is variable in diametric size continuously or in a stepwise manner. In this way, while the arrangement of the penetration hole switcher 10 per se should not be limited to the one illustrated herein, a practical example thereof may be the arrangement as disclosed in Japanese Laid-open Patent Application, Tokkaisho 62-223756(JP-A-62-223756).

The second aperture 7 is designed so that a respective one of the penetration holes 7a is movable in position along the directions X and Y by the XY-direction movable device 11.

On a beam output side of the charged particle optical system 9, a blanking means 14 is provided which includes a blanking electrode 12 and blanking aperture 13 for effectuation of ON and OFF of a focused ion beam produced. More specifically, in the case the focused ion beam B2 is deactivated or "OFFed," an appropriate voltage is applied to the blanking electrode 12 causing the focused ion beam B2 to deflect thereby blocking it at the blanking aperture 13. Note here that the layout of the blanking electrode 12 and blanking aperture 13 should not exclusively be limited to the illustrative one, and may alternatively be modified so that these are disposed over the charged particle optical system 9.

On the beam output side of the blanking aperture 13 a deflection electrode 16 is disposed for letting the focused ion beam B2 be scanned at any desired positions after having passed through the blanking aperture 13, whereby the focused ion beam B2 to be scanned by the deflection electrode 16 is irradiated at a desired location of a specimen 18 on a specimen support stage 17.

A secondary charged particle detector 19 is disposed over the specimen stage 17 for detection of secondary charged particles as released from the surface of the specimen 18 being irradiated with the focused ion beam B2. This secondary charged particle detector 19 is operatively coupled with an image control unit 20 and image display unit 21. The image control 20 is for obtaining a planar intensity distribution of such secondary charged particles while amplifying the resulting detection signal. The image display device 21 is for visual indication of a pattern that is formed on the specimen surface on the basis of a planar intensity distribution signal from this image control unit 20.

Further provided on the side of the specimen stage 17 is a "Faraday cup" structure 15 that is positionally exchangeable with the specimen stage 17. The Faraday cup 15 is the one which receives irradiation of the focused ion beam B2 in the alternative of the specimen 18 to thereby measure the resultant beam current thereof.

Additionally, the aforementioned drawout electrode 2 and blanking electrode 12 plus deflection electrode 16 are operatively associated with a draw-out power supply 22 and a blanking power supply 23 as well as deflection power supply 24 for application of desired voltages thereto, respectively. Furthermore, a control unit 25 is provided which consists essentially of a computer system that may provide overall controls to the entire focused ion beam apparatus configured as stated above while at the same time individually controlling a respective one of the XY-direction movable device 4, penetration hole switcher device 10, XY-direction movable device 11, and each of the power supplies 22–24 mentioned above.

In the focused ion beam apparatus thus arranged, it is possible to apply the intended machining processing to the specimen 18 under manufacture by allowing the charged particle optical system 9 to focus the ion beam B1 as drawn out of the ion source 3 while simultaneously letting the deflection electrode 16 scan this beam for irradiation onto the specimen 18. In addition, although not specifically illustrated in this example, a gas injection nozzle is provided in close proximity with the specimen 18 for simultaneous supplement of a chosen gas from the gas injection nozzle while the focused ion beam B2 is being irradiated, thereby enabling local fabrication of a chemical vapor deposition (CVD) film.

It is noted that during such machining processes, the machining status or situation may be readily observed by means of the image display device 21. In addition, although not particularly depicted in this example, the apparatus may also be arranged to employ optical microscope equipment for visual observation of the specimen surface being processed on a real time basis while the specimen 18 is being irradiated on its surface with generally available illumination light.

Figure 4A:
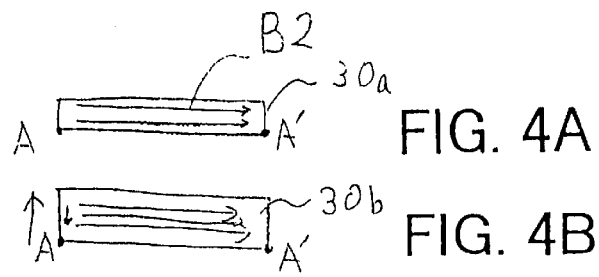
FIGS. 4A through 4D illustrate, in a time-sequential manner, some of major steps in the machining procedure of a specimen in a planar scan region using a focused ion beam, demonstrating that the region changes in size with time in this order of sequence.
Figure 4B:
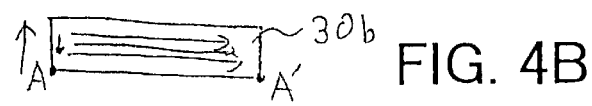
Figure 4C:
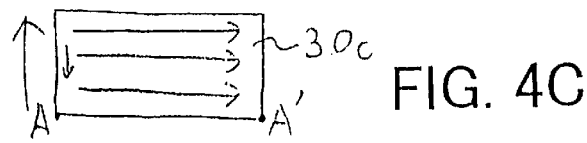
Figure 4D:
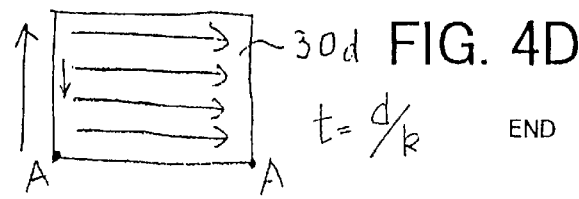
Figure 6:
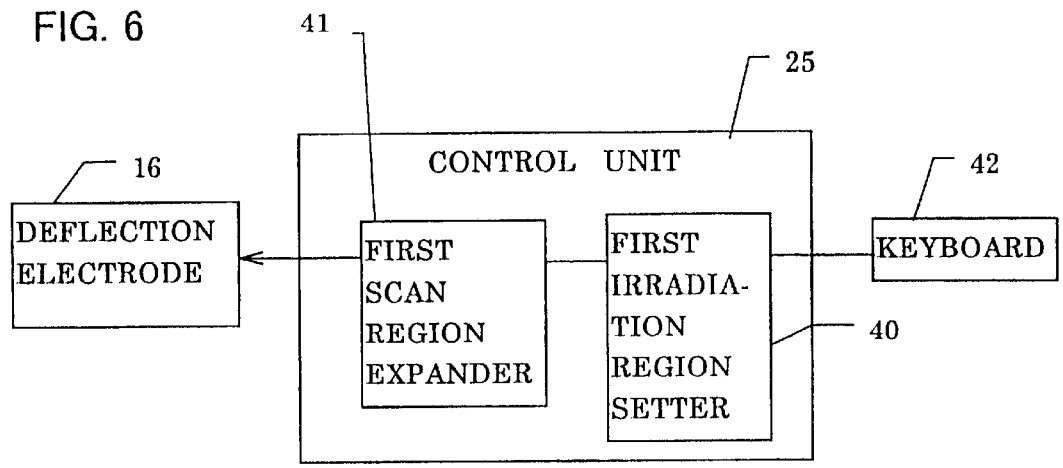
FIG. 6 depicts in block form one preferable configuration of a control unit in the apparatus shown in FIG. 2.

A configuration of the control unit 25 used in the apparatus of FIG. 2 is shown in block form in FIG. 6 in accordance with a first embodiment of the instant invention. As shown in FIG. 6, the control unit 25 is equipped with a first irradiation region setter 40 that is operable to set an irradiation region 30a of the focused ion beam B2 on the basis of an image on the surface of the specimen 18, which image is visualized on the screen of the image display device 21. Necessary data input to the first irradiation region seter 40 is performed through a keyboard unit 42. The first irradiation region setter 40 is the one that defines for setup the scan region 30a, which is of the elongate rectangular shape. This elongate rectangular scan region has its long side lines along the main scanning direction of the focused ion beam B2. The first irradiation region setter 40 is connected to a first scan region expander 41. The first scan region expander 41 is operatively responsible for area-increase or "expansion" of the elongate rectangular scan region as established at the first irradiation region setter 40. A way of enlarging or expanding the scan region by the first scan region expander 41 is as follows. As shown in FIGS. 4B to 4D, its side lines extending in the sub-scanning direction of focused ion beam B2 are increased in length while letting its remaining sides along the main scanning direction of focused ion beam B2 be kept constant. In FIGS. 4A–4D, the focused ion beam B2 is controlled to scan from the upper left. part in the rightward direction (in the main scan direction) and then sequentially scan it in the downward direction (sub-scan direction). When this is done, expand the irradiation region 30a in such a way as to offset the starting point of one frame. This may be reworded in a manner such that while one specific side indicated by line A–A' is secured or "pinned," the irradiation region 30 is expanded from a scan region 30b shown in FIG. 4B to a "grown" scan region 30d of FIG. 4D. An electrical signal from the first scan region expander 41 is input to the deflection electrode 16 via the deflection power supply 24. Note that such expansion of the scan region using the first scan region expander 41 may be achieved by expanding the region by a prespecified extent at a time after having repeatedly scanned a certain scan zone for a predetermined number of times, or alternatively attainable by expanding the region by a predefined extent once per each frame scan.

Figure 7:
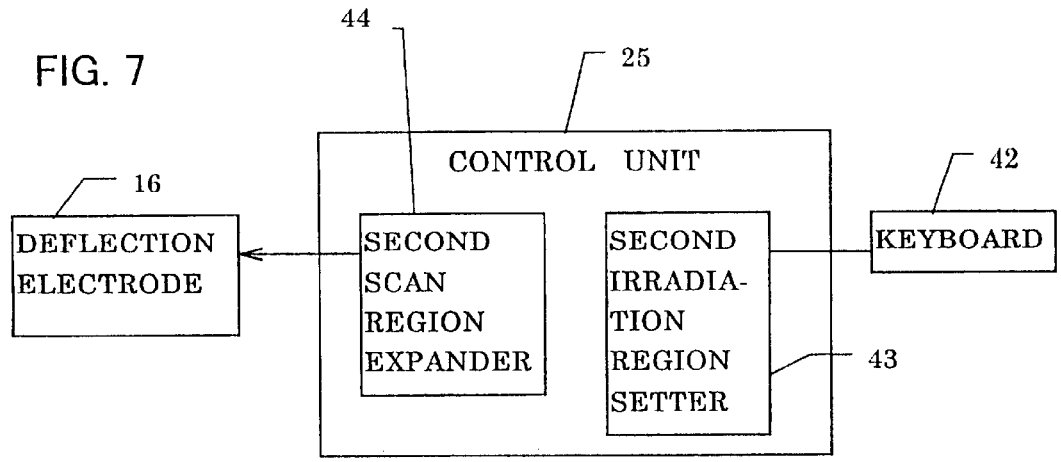
FIG. 7 shows in block form another configuration of the control unit of FIG. 2.

Another preferable configuration of the control unit 25 is illustrated in block form in FIG. 7, as a second embodiment of the present invention. As shown in FIG. 7, the control 25 is provided with a second irradiation region setter 43 that is for setup of an irradiation region 30d of focused ion beam B2 on the basis of an image of the surface of the specimen 18 on the image display device 21. Input of the second irradiation region setter 43 is done at the keyboard 42. The second irradiation region setter 43 is for setting the scan region 30d of the rectangular shape. This rectangular scan region 30*d* has its one side extending in the main scan direction of the focused ion beam B2. The second irradiation region setter 43 is operatively coupled to a second scan region expander 44. The second scan region expander 44 first performs setup of a scan region 30*a* that is shortened in the sub-scan direction while letting those side lines at the terminate ends in the sub-scan direction be kept in common, which lines are in parallel to the main scan direction of the scan region 30*d*. Then, let such elongate rectangular scan region 30*a* be irradiated for scanning with the focused ion beam B2. Next, during scan irradiation, widen or "expand" the to-be-scanned region of the rectangular shape 30*a* that has been initially set at the second scan region expander 44. A way of expanding the scan region by the second scan region expander 44 is such that its one selected side extending in the sub-scan direction is enlarged in length while letting its side along the main scan direction of the focused ion beam B2 be kept constant as shown in FIGS. 4B–4D. In FIGS. 4A–4D, the focused ion beam B2 is controlled scanning from the upper left part in the rightward direction (in the main scan direction) and then progressively scanning it in the downward direction (sub-scan direction). And, expand the irradiation region 30*a* so that the start point of one frame is offset in position. In other words, while one specific side denoted by line A–A' is fixed, the irradiation region 30 is expanded in planar size from a scan region 30*b* shown in FIG. 4B up to a scan region 30*d* of FIG. 4D. A signal form the second scan region expander 44 is input to the deflection electrode 16 by way of the deflection power supply 24. Note that such expansion of the scan region using the second scan region expander 44 is attainable by expanding the region by a specified extent at a time after having recurrently scanned a certain scan zone for a predetermined number of times, or alternatively by expanding the region by a predefined extend once per each frame scan.

An explanation will next be given of a method of machining a specimen using the focused ion beam apparatus arranged as described above.

Figure 3A:
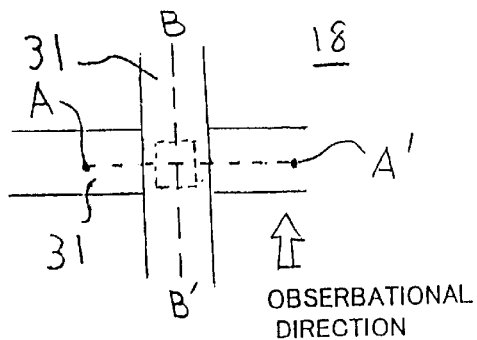
FIG. 3A is a partial plan view of a specimen being machined using a focused ion beam machining method embodying the invention.
Figure 3B:
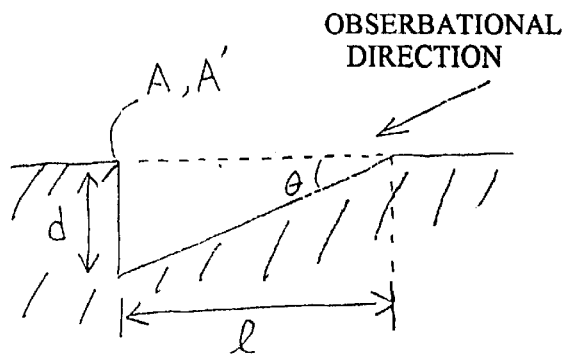
FIG. 3B illustrates in cross-section the specimen along line B–B' in FIG. 3A.

First of all, a semiconductor device was employed as the specimen 18. Obtain a peripheral image of the specimen at its selected part which is processed to have a predesigned cross-section or profile as shown in FIG. 3A. A cross-joint. pattern of wiring leads 31 is being observed. Subsequently, designate in this lead pattern image a profile fabrication portion A–A' along with the observation direction thereof. One example of the designation method is to connect together by a straight line a couple of characteristic points (start point A and end point A') of the profile fabrication portion. As shown by the B–B' cross-section in FIG. 3B, suppose that etching is applied to specified part which lies on the right side of the start point A on the straight line (corresponding to the upper portion of the line A–A' in FIG. 3A) while letting an exposed sidewall surface of the remaining part on the left side be the cross-section or profile required. Then, designate the machining depth d and the observation angle Θ for use during observation of such profile. Assuming that the coefficient of proportion k determinable by the machining rate is predefined at this time, the length l of a machined region after elapse of a t from startup of the machining process may be represented by $$l = k \times t \times \tan \Theta, \quad (1)$$

while the machining termination time is given as $$t = d/k. \quad (2)$$

Upon startup of the etching treatment, the region being etched is increased in area simultaneously in the way as defined by Equation (1); it ends when the machining time becomes equal to the time as defined by Equation (2).

At this time the focused ion beam scanning within the etching-processed region is performed in a specific direction extending parallel to the profile fabrication plane in a way such that scanning gets started at a portion furthest from the profile plane and is ended at the profile formation portion and thereafter returns at the scan start portion again.

To make long story short, obtain the position A–A' at which the intended profile is formed, and determine the initial focused ion beam B2's scan region 30 in a way which follows. In FIGS. 4A–4D, the rightward direction corresponds to the main scan direction whereas the upward direction is the sub-scan direction. As shown in FIG. 4A, let the main scan direction of the focused ion beam B2 be in parallel with the line A–A'; simultaneously, let the long side of the scan region 30 substantially overlap the line A–A'. This scan region is shaped so that it is less in length in the sub-scan direction of the focused ion beam B2. Next, a specified side line of the scan region opposing the line A–A' is first subject to the main scanning; then, scan the focused ion beam B2 progressively while allowing it to gradually approach and finally overlap the line A–A'. As shown in FIG. 4A, the main scanning of the focused ion beam B2 is controlled moving from the upper portion to the lower portion of the region 30*a*.

Figure 5A:
FIGS. 5A to 5C illustrate, incross-section, some of major steps in the focused ion beam machining procedure of the specimen in its scan region, showing that the region changes in profile with time in this order of sequence.
Figure 5B:
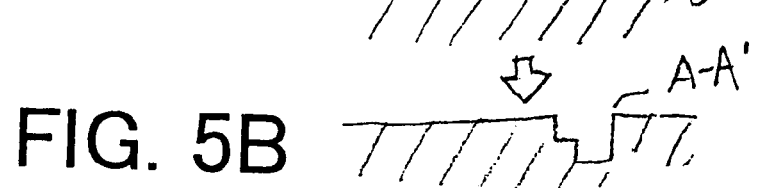
Figure 5C:
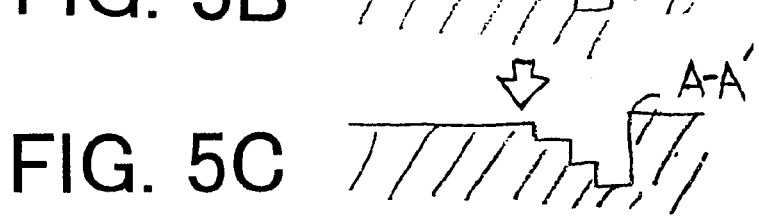

Then, widen or expand the scan region 30 allowing it to "grow" exhibiting enlarged planar shapes as shown in FIGS. 4B–4D in this order of sequence. Note that one side of the scan region 30 is aligned with and substantially overlap the line A–A' in any events during the processing. The sub-scan direction of the focused ion beam B2 is toward the line A–A' at all times. In other words, the sub-scan direction is the downward direction in FIGS. 4A–4D. A cross-section of the specimen 18 taken along line B–B' is shown in FIGS. 5A–5C in a time sequential manner, wherein the scan region 30 becomes wider with time in the way depicted in FIGS. 5A–5C in this order. Finally, the focused ion beam B2's final irradiation/scanning arrives at the line A–A'.

It must be further noted that upon effecting of this profile machining, if a need exists to observe structural features of the specimen at deeper locations thereof then it is required that may portions of the specimen be processed. Accordingly, in order to complete the intended processing in a practically reasonable time duration, a "special" ion beam of increased beam current with enhanced machining rate might be employed in some cases to effect the processing required. If this is the case, such accelerated etching can result in degradation of the profile finished. This in turn leads to the difficulty in attaining the intended profile observation and analysis activities.

Figure 8:
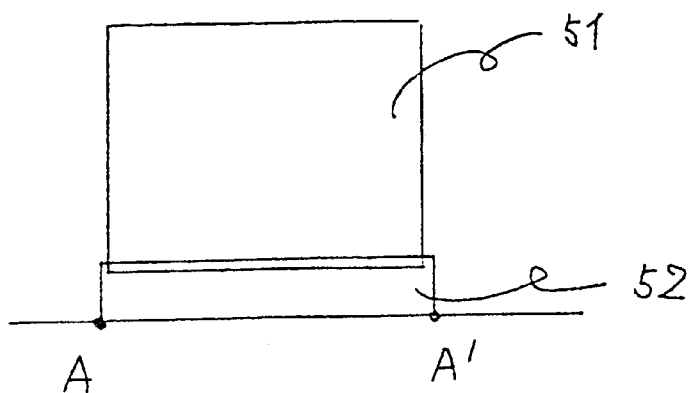
FIG. 8 is a pictorial representation of a to-be-etched region of a specimen for explanation of a focused ion beam machining method also embodying the present invention.

Fortunately, the difficulty may be avoided by a method unique to the present invention as follows. As shown in FIG. 8, perform as a first process the above-mentioned etching process using an ion beam of increased beam current; then, at a second step, effect the etching process using an ion beam of less in beam current. During the processing at the first etching step, a region 51 of interest being processed is provided at a location far from the cross-section line A–A' concerned. Then, at the second etching step, its region 52 being processed is provided so that it is aligned with the cross-section A–A'. The first etching process is done while expanding the ion beam irradiation region selected for the intended processing, with respect to the sub-scan direction. The second etching process is effected by uniformly irradiating the ion beam to locations within a defined machining region. Note however that the ion beam scanning within such machining region is to be done in directions parallel with the profile formation plane, wherein the scanning gets started at the part furthest from the profile and ends at a profile formation portion and thereafter returns to the scan initiation portion again. Additional etching in the second etching process may enable successful fabrication of a well finished cross-section or profile.

Figure 9A:
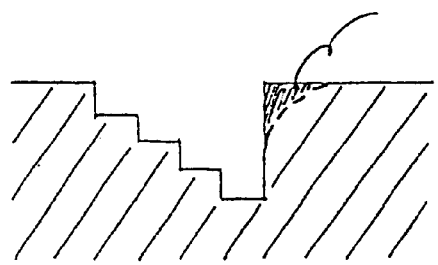
FIG. 9A is a sectional diagram of a specimen being processed by a focused ion beam machining method in accordance with a further embodiment of the invention.
Figure 9B:
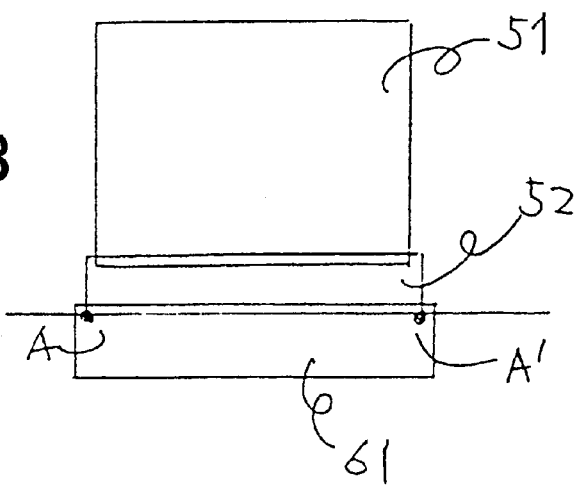
FIG. 9B is a partial plan view of the specimen of FIG. 9A with a chemical vapor deposition (CVD) film formed thereon during the focused ion beam machining procedure.

Another concern is that in cases where the machining for observation of structural properties at deeper locations results in an increase in amount of processing, expansion of an ion beam being irradiated will no longer be negligible. This results in sharp corner edges on the profile side being etched and rounded due to unintentional cutting, which edges are inherently required to stand at right angles as shown in the cross-section along line B–B' in FIG. 9A. To this end, as shown in FIG. 9B, fabricate a CVD film in a region 61 along the line A–A'. This CVD film functions as a mask thus enabling the corner edges to be prevented from being etched excessively. Note that this CVD film is formed while a gas or gases are being supplied from more than one gas injection nozzle, which is not illustrated in FIG. 2. Additionally, in view of the fact that the CVD film acting as the mask per se can be etched by an ion beam used, a region 61 may be set so that it goes beyond the line A–A'.

As has been described above, the present invention may offer several advantages as will be set forth below.

In accordance with the first means of the present invention, since those portions as exposed due to machining is subject to the etching processing on the surfaces thereof through the final-step scan/irradiation of an ion beam, resultant reattached materials may be successfully removed away thus preventing any possible contamination thereby.

In addition, according to the s econd means of the present invention, it becomes possible to minimize the reattached materials to the cross-section because of the fact that the profile machining plane being obtained is designed to experience the final ion beam scanning process.

Figure 1A:
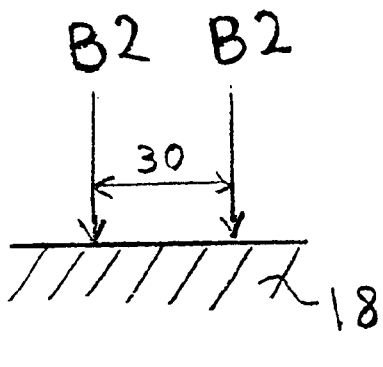
FIGS. 1A and 1B are diagrams for use in explaining the nature of machining processing using an ion beam.
Figure 1B:
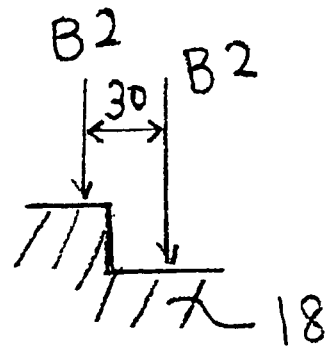

Furthermore, in the etching processing to a specimen using a focused ion beam, it has been well known that the machining speed thereof is greater at a corner edge portion in a machining region with a step-like difference shown in FIG. 1B as compared to flat planar portions in the region as shown in FIG. 1A. As a result, according to the method of the present invention, because the invention disclosed herein is specifically arranged so that the machining region is expanded gradually, the processing progresses to apply the etching to this edge portion at all times. Accordingly, it will be readily appreciated that an increased number of machining processes may be effected in a short time as compared to the prior art method as indicated in the introductory part of the description.

As has been explained supra, the present invention advantageously offers an ability to achieve the intended specimen machining processes in a short time while reducing the risk of reattachability.

What is claimed is:

1. In a focused ion beam machining method for machining through etching treatment of the surface of a specimen by recurrently irradiating a focused ion beam to a desired region of the specimen to thereby obtain a profile formation portion of the specimen, the step of: enlarging the recurrently scanned region with elapse of a time taken to etch the specimen.

2. The focused ion beam machining method as recited in claim 1; wherein scanning of the specimen with the focused ion beam is performed in parallel with the profile formation portion, and the profile formation portion is scanned after all other portions of the recurrently scanned region have been scanned.

3. In a focused ion beam machining method for machining through etching treatment the surface of a specimen by recurrently irradiating a focused ion beam to a desired region of the specimen to thereby obtain a profile formation portion of the specimen, the step of: scanning of the specimen with the focused ion beam so that the profile formation portion is machined after all other portions of the recurrently scanned region have been scanned.

4. A focused ion beam machining method for machining through etching treatment the surface of a specimen by recurrently irradiating a focused ion beam to a desired region of the specimen to thereby obtain a profile formation portion of the specimen, the method comprising:
a first etching step for increasing the recurrently scanned region of the specimen to become larger with the elapse of time during etching of the specimen; and
a second etching step for causing the profile formation portion to be machined after all other portions of the recurrently scanned region have been scanned.

5. The focused ion beam machining method as recited in claim 4; wherein a current value of a focused ion beam used in the first etching step is greater than a current value of a focused ion beam used in the second etching step.

6. A focused ion beam machining apparatus comprising: a liquid-metal ion source for generation of ions of liquid metal; a draw-out electrode for use in drawing ions of liquid metal out of the liquid-metal ion source to provide an ion beam; a lens for focussing the ion beam to provide a focused ion beam; a deflection electrode for scanning the focused ion beam onto a rectangular scan region of a specimen; a detector for detection of secondary electrical charged particles generatable from the specimen surface due to irradiation of the focused ion beam onto the specimen; an image display device for displaying an image of the specimen surface on the basis of the intensity of secondary charged particles detected by the detector; and a scan region expander for expansion of the scan region by changing the position of only one side of the rectangle during scanning of the scan region, so that the deflection electrode is controlled on the basis of a signal output from the scan region expander, the focused ion beam is irradiated onto the specimen, and the specimen is machined after all other portions of the scan region have been scanned.

7. The focused ion beam machining apparatus as recited in claim 6; wherein the one side of the rectangular scan region is in parallel with a main scanning direction of the focused ion beam.

8. The focused ion beam machining apparatus as recited in claim 7; wherein the scan region expander for expansion of the scan region of the rectangular shape is operable to change a position of another side of the rectangle extending in a subsidiary scanning direction of the focused ion beam.

9. A focused ion beam machining apparatus comprising: a liquid-metal ion source for generation of ions of liquid metal; a draw-out electrode for use in drawing ions of liquid metal out of the liquid metal ion source to provide an ion beam; a lens for focussing the ion beam to provide a focused ion beam; a deflection electrode for scanning the focused ion beam onto a rectangular scan region of a specimen; a detector for detection of secondary charged particles generated by the specimen surface due to irradiation of the focused ion beam onto the specimen; an image display device responsive to an intensity of secondary charged particles as detected by the detector for visually indicating an image of the specimen surface; a scan region setter for setting-up the scan region of the focused ion beam into a rectangular shape; and a scan region expander for first setting within the scan region an initial scan region of the focused ion beam narrower than the scan region set up by the scan region setter by offsetting only one side of the rectangular scan region and for sequentially expanding the initial scan region up to the scan region in accordance with recurrent scan irradiation of the specimen; wherein the deflection electrode is controlled on the basis of a signal output by the scan region expander, the focused ion beam is irradiated onto the specimen, and the specimen is machined.

10. The focused ion beam machining apparatus as recited in claim 9; wherein the one side of the scan region is in parallel with a main scanning direction of the focused ion beam.

11. The focused ion beam machining apparatus as recited in claim 9; wherein the scan region expander for expansion of the scan region of the rectangular shape is operable to change the position of another side of the rectangle extending in a sub-scanning direction of the focused ion beam.

12. A focused ion beam machining method for analyzing a profile of a sample, comprising the steps of:
 etching a desired region of a sample by directing a focused ion beam to the desired region of the sample to create a profile thereof in the desired region;
 repetitively scanning the focused ion beam throughout the desired region to etch the surface of the sample and to find a desired profile of the sample to be analyzed; and
 expanding the region to be scanned while conducting the scanning, and scanning the portion of the sample where the profile is to be created after scanning all other portions of the desired region.

13. A focused ion beam machining method according to claim 12; wherein the step of etching a desired region of the sample surface is performed using an ion beam instrument comprising an ion beam source, an ion beam focusing system for focusing the ion beam to produce a focused ion beam and projecting the focused ion beam onto the sample surface, a scanning electrode for controlling the position of the focused ion beam with respect to the sample surface so as to cause the focused ion beam to scan across the desired region of the sample surface, and a sample support for supporting the sample and having a mechanism for moving the sample with respect to the focused ion beam.

14. A focused ion beam machining method according to claim 12; wherein the step of etching a desired region of the sample surface is conducted using a focused ion beam instrument comprising an ion source, a draw out electrode, a first aperture member for passing only a central portion of the ion beam produced by the ion source, charged particle optics comprising a condenser lens, a second aperture member, and an objective lens for focusing the ion beam, a scanning electrode for controlling the position of the focused ion beam with respect to the sample surface so as to cause the focused ion beam to scan across the desired region of the sample surface, and a sample support for supporting the sample and having a mechanism for moving the sample with respect to the focused ion beam.

15. A focused ion beam machining method according to claim 14; wherein the second aperture has a plurality of holes therethrough, and further comprising a hole switching device allowing one of the plural holes to be placed in the path of the focused ion beam.

16. A focused ion beam machining method according to claim 14; further comprising blanking means for turning the focused ion beam on or off, the blanking means having a blanking electrode and a blanking aperture and being disposed on one of a beam exit side of the charged particle optics and a beam entry side of the charged particle optics.

17. A focused ion beam machining method according to claim 14; further comprising an actuator for moving the ion source relative to the sample support.

18. A focused ion beam machining method according to claim 14; further comprising a secondary charged particle detection system disposed proximate the sample for detecting particles emitted by the sample as a result of etching using the focused ion beam, and an image display for displaying an image based upon a charged particle intensity distribution output by the charged particle detection system.

19. A focused ion beam machining method according to claim 18; wherein the charged particle detection system comprises a charged particle detector and an amplifier for amplifying a charged particle signal and detecting a charged particle intensity distribution.

20. A focused ion beam instrument comprising: an ion beam source for producing an ion beam; a focusing optical system for focusing the ion beam and producing a focused ion beam for irradiation of a sample in a desired rectangular scan region; a sample stage for supporting a sample under observation in a plane perpendicular to that of the focused ion beam; and a scan region expander for expanding the scan region by changing the position of one side of the rectangle during scanning of the scan region.

21. A focused ion beam instrument according to claim 20; further comprising an observation system for detecting the composition of particles etched from the sample.

22. A focused ion beam instrument according to claim 20; wherein the ion beam source comprises a liquid metal ion source for producing an ion beam, and a draw out electrode for directing the ion beam.

23. A focused ion beam instrument according to claim 22; wherein the ion source further comprises an X-Y translator, on which the liquid metal ion source is mounted, for moving the ion source in a plane perpendicular to that of the ion beam.

24. A focused ion beam instrument according to claim 20; wherein the ion beam source includes a first aperture member having an aperture therethrough for passing a central portion of the ion beam.

25. A focused ion beam instrument according to claim 20; wherein the ion beam comprises Gallium.

26. A focused ion beam instrument according to claim 20; wherein the focusing optical system comprises a condenser lens, a second aperture member, and an objective lens.

27. A focused ion beam instrument according to claim 26; wherein the focusing optical system further comprises a second aperture member having a plurality of individually selectable aperture holes, and a switching device for displacing the second aperture member for selecting one of the plural aperture holes.

28. A focused ion beam instrument according to claim 20; further comprising blanking means for turning the ion beam on and off and having a blanking electrode and a blanking aperture on one of a beam exit side and a beam entry side of the focusing optical system.

29. A focused ion beam instrument according to claim 20; further comprising a deflection electrode for selectively deflecting the focused ion beam with respect to the sample.

30. A focused ion beam instrument according to claim 20; further comprising a secondary charged particle detector disposed above the sample, an amplifier for amplifying a charged particle signal and detecting a secondary intensity distribution, and an image display.

31. A focused ion beam instrument according to claim 20; further comprising a Faraday cup disposed adjacent the sample stage to detect the current of the focused ion beam.

32. A focused ion beam instrument according to claim 20; further comprising a gas ejection nozzle disposed proximate the sample for emitting a selected gas onto the sample during processing such that a thin film may be grown on the sample using the gas.

* * * * *